US010621604B2

(12) United States Patent
Yang et al.

(10) Patent No.: US 10,621,604 B2
(45) Date of Patent: Apr. 14, 2020

(54) METHOD FOR DEFINING METROPOLITAN AREA BASED ON REGIONAL INTER-CITY FLOW INTENSITY MEASUREMENT MODEL

(71) Applicant: SOUTHEAST UNIVERSITY, Nanjing (CN)

(72) Inventors: Junyan Yang, Nanjing (CN); Yuzhuo Wang, Nanjing (CN); Jun Cao, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 16/086,316

(22) PCT Filed: May 4, 2016

(86) PCT No.: PCT/CN2016/081020
§ 371 (c)(1),
(2) Date: Sep. 19, 2018

(87) PCT Pub. No.: WO2017/166370
PCT Pub. Date: Oct. 5, 2017

(65) Prior Publication Data
US 2019/0333177 A1    Oct. 31, 2019

(30) Foreign Application Priority Data

Mar. 29, 2016 (CN) .......................... 2016 1 0188931

(51) Int. Cl.
*G06Q 30/02* (2012.01)
*G06T 11/20* (2006.01)
(Continued)

(52) U.S. Cl.
CPC ......... *G06Q 30/0205* (2013.01); *G06F 30/13* (2020.01); *G06T 11/206* (2013.01); *G09B 29/007* (2013.01); *G06F 16/29* (2019.01)

(58) Field of Classification Search
CPC ........ G06Q 50/26; G06Q 50/28; G06Q 90/00; G06Q 30/02–0205; G06Q 50/10;
(Continued)

(56) References Cited

U.S. PATENT DOCUMENTS

2010/0042394 A1* 2/2010 Khan .................... G06Q 10/04
703/11
2013/0046586 A1   2/2013 Lerner et al.
(Continued)

FOREIGN PATENT DOCUMENTS

| CN | 102024206 A |   | 4/2011 |
| CN | 103106630 A |   | 5/2013 |
| CN | 102508869 B | * | 11/2013 |

OTHER PUBLICATIONS

Al Kaabi, "The Geography of Air Freight and Metropolitan Economies: Potential Connections" (Year: 2010).*
(Continued)

*Primary Examiner* — Christine M Behncke
*Assistant Examiner* — Shelby A Turner
(74) *Attorney, Agent, or Firm* — Bayramoglu Law Offices LLC

(57) ABSTRACT

A method for defining a metropolitan area based on a regional inter-city flow intensity measurement model includes the following steps: 1. determining an urban agglomeration regional range to be measured and inter-city flow associated cities; 2. measuring, according to the determined associated cities, itemized regional inter-city flow intensities of each group of the associated cities; 3. calculating through weighing, according to the itemized regional inter-city flow intensity values, integrated inter-city flow intensities and membership degrees thereof between a central city and other associated cities; 4. recording the above data into an ArcGIS library, and establishing a regional inter-city flow database through association between spatial
(Continued)

data and table data. 5. performing four groups of naturally intermittent type clustering analysis on data in the established regional inter-city flow database, and finally determining the range of a metropolitan area in a narrow sense and in a broad sense.

2 Claims, 9 Drawing Sheets

(51) Int. Cl.
*G09B 29/00* (2006.01)
*G06F 30/13* (2020.01)
*G06F 16/29* (2019.01)

(58) Field of Classification Search
CPC ...... G06F 17/50; G06F 17/5004; G06F 16/29; G06F 17/30241; G06T 11/20; G06T 11/203; G06T 11/206; G09B 29/00; G09B 29/003; G09B 29/005; G09B 29/006; G09B 29/007; G09B 29/008; Y04S 50/14; Y04S 40/22; Y02E 60/76
See application file for complete search history.

(56) References Cited

U.S. PATENT DOCUMENTS

| | | | |
|---|---|---|---|
| 2013/0211963 A1 | 8/2013 | Williams | |
| 2014/0089036 A1* | 3/2014 | Chidlovskii | G06Q 10/06 705/7.27 |
| 2014/0354677 A1* | 12/2014 | Fan | G06T 11/001 345/595 |
| 2016/0125628 A1* | 5/2016 | Barnes | G06T 17/05 345/440 |

OTHER PUBLICATIONS

Batty, "Urban Modelling", Cambridge University Press (Year: 1976).*
Choi et al., "Comparing world city networks: a network analysis of Internet backbone and air transport intercity linkages" (Year: 2006).*
Comi et al., "Urban Freight Models", Modelling Freight Transport, Ch. 8, pp. 163-200 (Year: 2014).*
Dai, "A new pattern of extended metropolitan regions (EMRs) in China: case study of the Changzhutan (CZT) EMR", Hong Kong Baptist University, HKBU Institutional Repository (Year: 2013).*
Dai et al., "Spatial Interaction and Network Structure Evolvement of Cities in Terms of China's Rail Passenger Flows", Chin. Geogra. Sci. 18(3) 206-213 (Year: 2008).*
Derudder et al., "Measurement and Interpretation of Connectivity of Chinese Cities in World City Network", Chin. Geogra. Sci. vol. 23 No. 3 pp. 261-273 (Year: 2013).*
Devriendt et al., "Cyberplace and Cyberspace: Two Approaches to Analyzing Digital Intercity Linkages", Journal of Urban Technology vol. 15, No. 2, pp. 5-32 (Year: 2008).*
Diaz-Lanchas et al., "Trade margins, transport cost thresholds and market areas: Municipal freight flows and urban hierarchy", Economic Analysis Working Paper Series (Year: 2013).*

Hao et al., "The rise of big data on urban studies and planning practices in China: Review and open research issues", Journal of Urban Management 4, 92-124 (Year: 2015).*
Helpman et al., "Estimating Trade Flows: Trading Partners and Trading Volumes", Nber Working Paper Series (Year: 2007).*
Ivanova, "Modelling Inter-Regional Freight Demand with Input-Output, Gravity and SCGE Methodologies", Modelling Freight Transport, Ch. 2 (Year: 2014).*
Jun et al., "Analysis of the Space Economic Ties of Urban Agglomeration in the Central Delta based on City flow intensity and GIS", 2014 Fifth International Conference on Intelligent Systems Design and Engineering Applications (Year: 2014).*
Liang et al., "Research on spatial difference in the effecting factors of the urban flow", Proceedings of SPIE, Geoinformatics 2007 (Year: 2007).*
Lin et al., "Network analysis of China's aviation system, statistical and spatial structure", Journal of Transport Geography 22 (2012) 109-117 (Year: 2012).*
Lin et al., "Simulating urban growth in a metropolitan area based on weighted urban flows by using web search engine", International Journal of Geographical Information Science (Year: 2015).*
Liu et al. "Spatial Economic Interaction of Urban Agglomeration: Gravity and Intercity Flow Modeling & Empirical Study", 2008 International Conference on Management Science & Engineering (15th) (Year: 2008).*
Ma et al., "Structure of Chinese City Network as Driven by Technological Knowledge Flows", Chin. Geogra. Sci. 2015 vol. 25 No. 4 pp. 498-510 (Year: 2015).*
Matsumoto, "International urban systems and air passenger and cargo flows: some calculations", Journal of Air Transport Management 10 (2004) 241-249 (Year: 2004).*
Minqing et al., "Evaluating Node Importance in Complex Networks Based on Factor Analysis", 2011 International Conference on Computer Science and Network Technology (Year: 2011).*
Qin et al., "Formation Mechanism and Spatial Pattern of Urban Agglomeration in Central Jilin of China", Chinese Geographical Science, vol. 16, No. 2, pp. 154-159 (Year: 2006).*
Sharma et al., "Freight Data Mining Strategy Using Socio-economic Variables for Metropolitan Planning", 2010 IEEE International Conference on Granular Computing (Year: 2010).*
Taylor et al., "Measurement of the World City Network", Urban Studies, vol. 39, No. 13, 2367-2376 (Year: 2002).*
Tong et al., "Empirical Analysis of City Contact in Zhujiang (Pearl) River Delta,China", Chin. Geogra. Sci. 2014 vol. 24 No. 3 pp. 384-392 (Year: 2014).*
Tsekeris, "Interregional trade network analysis for road freight transport in Greece", Transportation Research Part E 85 (2016) 132-148 (Year: 2015).*
Vachal et al., "Transportation Quality Indices for economic Analysis of Non-metropolitan Cities", Upper Great Plains Transportation Institute Department Publication No. 158 (Year: 2004).*
Xuejiao, "Analysis of the linkage effect between regional economic development and logistics competitiveness in China", Acta Oeconomica, vol. 65 (S2), pp. 239-249 (Year: 2015).*
Zhong et al., "Detecting the dynamics of urban structure through spatial network analysis", International Journal of Geographical Information Science, vol. 28, No. 11, 2178-2199 (Year: 2014).*
Chengshu Luo, Research on the Formation and Development of Hangzhou Metropolitan Area, Master's Theses of Zhejiang University, Dec. 31, 2010, text, pp. 19-29.

* cited by examiner

METHOD FOR DEFINING METROPOLITAN AREA BASED ON REGIONAL INTER-CITY FLOW INTENSITY MEASUREMENT MODEL

CROSS REFERENCE TO RELATED APPLICATIONS

This application is the national phase entry of International Application PCT/CN2016/081020, filed on May 4, 2016, which is based upon and claims priority to Chinese Patent Application No. CN 201610188931.8, filed on Mar. 29, 2016, the entire contents of which are incorporated herein by reference.

TECHNICAL FIELD

The present invention relates to the field of regional analysis in urban planning, and more particularly to a method for quantitative analysis and measurement of inter-city relationships and for defining of a large-scale particular regional range in regional analysis of urban planning.

BACKGROUND

With social and economic development and the advance of globalization and informatization, cities are playing an increasingly important role in regional development, the social and economic linkages between cities in a region are closer and more complex, and internal connectivity in a metropolitan area has more significant influence on the defining of the range of each circle in the metropolitan area.

So far, in the field of urban planning, a metropolitan area is usually defined by using an economic geography model, such as an economic distance method, an economic gravity method, and an economic field strength method, the economic impact of a central city to the other cities around is simply calculated through economic data of each city and distance data between the cities, and the range of a metropolitan area is defined according to the degree of the impacts. Such method has the problems of limited perspectives and limited elements, and does not concern social factors, other than direct economic impact, that influence the inter-city association degree. Besides, an existing defining method usually judges interval values of economic impact of a central city to the other cities by subjective views and experience, and member cities in each circle of a metropolitan area are determined accordingly. In view of the above, the existing conventional method for defining circles of a metropolitan area has many problems, and is inapplicable to large-scale regional city analysis.

SUMMARY

Objective of the Invention

To eliminate defects in the prior art, the present invention provides a method for quantitatively and comprehensively measuring city linkage intensity in a multi-factor mode, accordingly defining the multi-circle range of a metropolitan area, and determining member cities in each circle of the metropolitan area.

Technical Solution

To achieve the above objective, the present invention provides a method for defining a metropolitan area based on a regional inter-city flow intensity measurement model. The method includes the following steps:

Step 1: determining an urban agglomeration regional range centered with a metropolitan city as a spatial range of a metropolitan area to be defined, identifying a plurality of to-be-measured basic city units in the regional range, and further determining inter-city flow associated cities;

Step 2: measuring, according to the associated cities determined in Step 1, itemized regional inter-city flow intensities of each group of the associated cities, wherein five items, namely, economic flow, passenger flow, freight flow, technical flow, and information flow are comprised;

Step 3: calculating through weighing, according to the five itemized regional inter-city flow intensity values of economic flow, passenger flow, freight flow, technical flow, and information flow that are measured in Step 2, integrated inter-city flow intensities and membership degrees thereof between a central city and other associated cities;

Step 4: drawing a CAD graph of related vectors about provinces and cities in the region and recording the data into an ArcGIS library, recording, in the ArcGIS library, the five itemized regional inter-city flow intensity values measured in Step 2 as well as data of the integrated inter-city flow intensity membership degrees between the central city and the other associated cities that are measured in Step 3, and establishing a regional inter-city flow database through association between spatial data and table data;

Step 5: performing four groups of naturally intermittent type clustering analysis on the data of the integrated inter-city flow intensity membership degrees $\bar{f}_{AB_i}$ in the regional inter-city flow database established in Step 4, obtaining member cities belonging to a core layer, a fringe layer, and a radiation layer of the metropolitan area respectively according to clustered data segments in descending order by size, and finally determining the range of the metropolitan area in a narrow sense and in a broad sense.

The determining an urban agglomeration regional range to be measured and inter-city flow associated cities in Step 1 includes the following specific steps:

Step 1.1: selecting a metropolitan city A as a regional core and as a central city of the metropolitan area;

Step 1.2: defining provinces and cities neighboring to the metropolitan city A selected in Step 1.1 and the province where the metropolitan city A belongs as a to-be-measured regional inter-city flow spatial range;

Step 1.3: based on the to-be-measured regional inter-city flow spatial range defined in Step 1.2, selecting cities at prefecture level and above in the range as to-be-measured basic city units, and determining N cities, numbered as $B_1$, $B_2$, ..., $B_i$, ..., $B_N$, that have inter-city linkage with the metropolitan city A;

Step 1.4: based on the city $B_i$ determined in Step 1.3, obtaining to-be-measured regional inter-city flow associated cities in combinations of $A\_B_1, A\_B_2, \ldots, A\_B_i, \ldots, A\_B_N$.

The measuring the five itemized regional inter-city flow intensities including economic flow, passenger flow, freight flow, technical flow, and information flow in Step 2 includes the following specific steps:

Step 2.1: measuring inter-city economic flow of the associated cities $A\_B_i$ determined in Step 1.4; acquiring, through city statistical yearbooks and related city data materials of the provinces and cities, non-agricultural population $U_A$, $U_{B_i}$ of each city, GDP $G_A$, $G_{B_i}$ of each city, and a spatial linear distance $D_{AB_i}$ between the central city A and each of the other cities $B_i$; and calculating inter-city economic linkage volumes $E_{AB_i}$ and corresponding inter-city economic flow intensities $Ef_{AB_i}$ of the associated cities:

$$E_{AB_i} = \frac{\left(\sqrt{U_A G_A} \times \sqrt{U_{B_i} G_{B_i}}\right)}{D_{AB_i}^2}; Ef_{AB_i} = \frac{E_{AB_i}}{\sum_{n=1}^{N} E_{AB_n}};$$

Step 2.2: measuring inter-city passenger flow of the associated cities $A\_B_i$ determined in Step 1.4; acquiring daily highway long-distance passenger traffic shifts $PC_{AB_i}$ and daily railway stopover shifts $PR_{AB_i}$ between the central city A and each of the other cities $B_i$; determining that the average daily traffic volume coefficient α of coaches is 0.1 and the average daily traffic volume coefficient β of railways is 0.9 according to differences of the average daily departure frequency and unit traffic volume of the coaches and railways; and calculating a ratio of inter-city passenger traffic linkage volume of each group of the associated cities in the total regional passenger traffic linkage volume, to obtain the inter-city passenger flow intensity $Pf_{AB_i}$ of each group of the associated cities in the region:

$$Pf_{AB_i} = \frac{PC_{AB_i}}{\sum_{n=1}^{N} PC_{AB_n}} \times \alpha + \frac{PR_{AB_i}}{\sum_{n=1}^{N} PR_{AB_n}} \times \beta;$$

Step 2.3: measuring inter-city freight flow of the associated cities $A\_B_i$ determined in Step 1.4; acquiring highway mileages $M_A$, $M_{B_i}$ in each city, total highway freight turnover $R_A$, $R_{B_i}$ of each city, and the spatial linear distance $D_{AB_i}$ between the central city A and each of the other cities $B_i$; and calculating the inter-city freight linkage volume $F_{AB_i}$ and the inter-city freight flow intensity $Ff_{AB_i}$ of each group of the associated cities:

$$F_{AB_i} = \frac{\left(\sqrt{M_A R_A} \times \sqrt{M_{B_i} R_{B_i}}\right)}{D_{AB_i}^2}; Ff_{AB_i} = \frac{F_{AB_i}}{\sum_{i=1}^{N} F_{AB_i}};$$

Step 2.4: measuring inter-city technical flow of the associated cities $A\_B_i$ determined in Step 1.4, acquiring the number of articles $C_{AB_i}$ collaborated by colleges and universities as well as research institutions from the central city A and each of the other cities $B_i$; and calculating a ratio of innovative technology cooperation frequency of each group of the associated cities in the total regional innovative technology cooperation volume, to obtain the inter-city technical flow intensity $Cf_{AB_i}$ of each group of the associated cities in the region:

$$Cf_{AB_i} = \frac{C_{AB_i}}{\sum_{n=1}^{N} C_{AB_n}};$$

Step 2.5: measuring inter-city information flow of the associated cities $A\_B_i$ determined in Step 1.4; acquiring mutual network search frequency $I_{AB_i}$ between the central city A and each of the other cities $B_i$; and calculating a ratio of network information linkage volume of each group of the associated cities in the total regional network information linkage volume, to obtain the inter-city information flow intensity $If_{AB_i}$ of each group of the associated cities in the region:

$$If_{AB_i} = \frac{I_{AB_i}}{\sum_{n=1}^{N} I_{AB_n}}.$$

The calculating through weighing, according to the five itemized regional inter-city flow intensity values of economic flow, passenger flow, freight flow, technical flow, and information flow that are measured in Step 2, integrated inter-city flow intensities and membership degrees thereof between a central city and other associated cities in Step 3 includes the following specific steps:

Step 3.1: determining the relative significance of the five itemized regional inter-city flows, namely, economic flow, passenger flow, freight flow, technical flow, and information flow, and representing the weight coefficient of each regional inter-city flow by $$\delta_k, \sum_{k=1}^{S} \delta_k = 1;$$

and adopting an average weighing manner based on the close significance of the five itemized regional inter-city flows, that is, the weight coefficient of the five itemized regional inter-city flows is 0.25;

Step 3.2: calculating the integrated inter-city flow intensity $f_{AB_i}$ between the central city A and each of the other cities $B_i$ through the following average weighing formula according to the inter-city economic flow intensity $Ef_{AB_i}$, inter-city passenger flow intensity $Pf_{AB_i}$, inter-city freight flow intensity $Ff_{AB_i}$, inter-city technical flow intensity $Cf_{AB_i}$, and inter-city information flow intensity $If_{AB_i}$ between the central city A and each of the other cities $B_1$, that are measured in Step 2:

$$f_{AB_i} = Ef_{AB_i} \times \delta_1 + Pf_{AB_i} \times \delta_2 + Ff_{AB_i} \times \delta_3 + Cf_{AB_i} \times \delta_4 + If_{AB_i} \times \delta_5;$$

Step 3.3: obtaining, through normalized standardization, the integrated inter-city flow intensity membership degree $\overline{B}_i$ between the central city A and each of the other cities $f_{AB_i}$ according to the integrated inter-city flow intensity $\overline{B}_i$ between the central city A and each of the other cities $\overline{f}_{AB_i}$ measured in Step 3.2:

$$\overline{f}_{AB_i} = \frac{f_{AB_i}}{\sum_{n=1}^{N} f_{AB_n}} \times 100\%.$$

The recording, in ArcGIS, the CAD data of related vectors about the provinces and cities in the region as well as the itemized and integrated inter-city flow intensity data measured in Step 2 and Step 3, and establishing a regional inter-city flow database in Step 4 includes the following specific steps:

Step 4.1: importing, into the ArcGIS database, a CAD data layer of vector boundary lines of the provinces and cities as well as a CAD data layer of vector points at spatial positions of administrative centers of the central city and each of the other cities in the urban agglomeration regional range defined in Step 1;

Step 4.2: drawing, in AutoCAD, a linkage network line between the central city A and each of the other cities $B_i$, numbering the linkage network lines as $A\_B_i$ and importing a CAD layer of vector linkage lines between the associated cities into the ArcGIS database;

Step 4.3: translating, from an EXCEL file format, and recording, in the ArcGIS database, the five itemized regional inter-city flow intensity values: economic flow intensity $B_i$, passenger flow intensity $Ef_{AB_i}$, freight flow intensity $Pf_{AB_i}$, technical flow intensity $Ff_{AB_i}$, information flow intensity $Cf_{AB_i}$, and integrated inter-city flow intensity membership degree $If_{AB_i}$ between the central city A and each of the other cities $\bar{T}_{AB_i}$ that are measured in Step 2;

Step 4.4: performing spatial association of vector layers on each layer of the data and table association on the measurement data in Step 4.1, Step 4.2, and Step 4.3, and establishing a regional inter-city flow database;

Step 4.5: automatically displaying the line thickness of "$A\_B_i$ city linkage lines" according to the five itemized regional inter-city flow intensity values, and outputting five schematic diagrams of itemized regional inter-city flow intensities by ArcGIS; automatically displaying the line thickness of "$\bar{T}_{AB_i}$ city linkage lines" according to the values of the integrated inter-city flow intensity membership degrees $A\_B_i$, and outputting a schematic diagram of integrated inter-city flow intensities.

The performing four groups of naturally intermittent type clustering analysis on the data of the integrated inter-city flow intensity membership degrees $\bar{T}_{AB_i}$ in the regional inter-city flow database, obtaining member cities belonging to a core layer, a fringe layer, and a radiation layer of the metropolitan area respectively according to clustered data segments in descending order by size, and finally determining the range of the metropolitan area in a narrow sense and in a broad sense in Step 5 includes the following specific steps:

Step 5.1: performing four groups of naturally intermittent type clustering on the data of the integrated inter-city flow intensity membership degrees $\bar{T}_{AB_i}$ of each "city linkage line" in Step 4.4) by using a naturally intermittent type clustering method through a "clustering analysis" module in ArcGIS software, and sorting the four groups of data segments after clustering in descending order by size into: a first group, a second group, a third group, and a fourth group;

Step 5.2: defining other cities associated with the central city A and corresponding to the "city linkage lines" in the first group, the second group, and the third group of data segments as member cities belonging to a core layer, a fringe layer, and a radiation layer of the metropolitan area, where other cities corresponding to the "city linkage lines" in the fourth group of data segments are not covered in the range of the metropolitan area;

Step 5.3: obtaining the range of the metropolitan area centered with the city A in a narrow sense and in a broad sense based on Step 5.2, wherein the range of the metropolitan area in a narrow sense consists of the central city and the core layer cities; and the range of the metropolitan area in a broad sense consists of the central city, the core layer cities, the fringe layer cities, and the radiation layer cities.

Beneficial effects: Compared with the prior art, the present invention has the following advantages:

(1) Innovative relation perspective: The method focuses, from the perspective of "flow", on inter-city linkages and interactions in a regional range, so as to define the range of each circle of a metropolitan area based on the measurement, which compensates the defect in the conventional method that the inter-city social and economic linkages are omitted due to over-concern of individual urban features.

(2) Objective and rational quantitative measurement: The method acquires diversified social and economic data and measures inter-city linkage intensities through calculation by using related formulas. The quantitative measurement method is more objective and rational, and the defined range of circles of a metropolitan area is more scientific and reasonable.

(3) Multi-factor comprehensiveness: The method performs itemized measurement on regional inter-city flows from five aspects, namely, economic linkage, passenger transportation, freight transportation, innovative technology, and network information, and concludes after itemized measurement. The content of multi-factor measurement comprehensively covers each aspect of social economy related to inter-city linkage, so that the method is good in comprehensiveness.

DETAILED DESCRIPTION OF THE EMBODIMENTS

Figure 1:
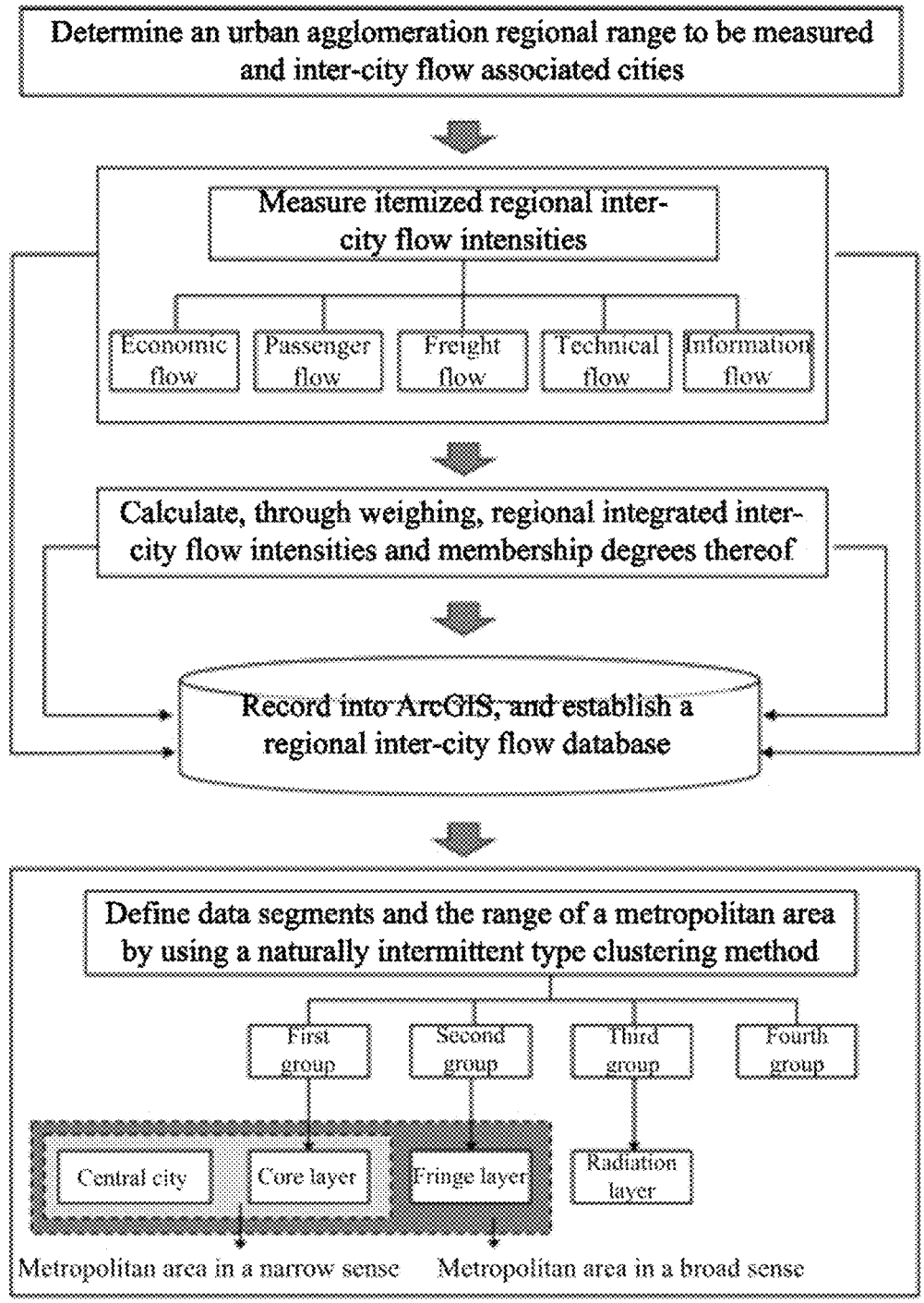
FIG. 1 is a flow chart of the present invention.
Figure 2:
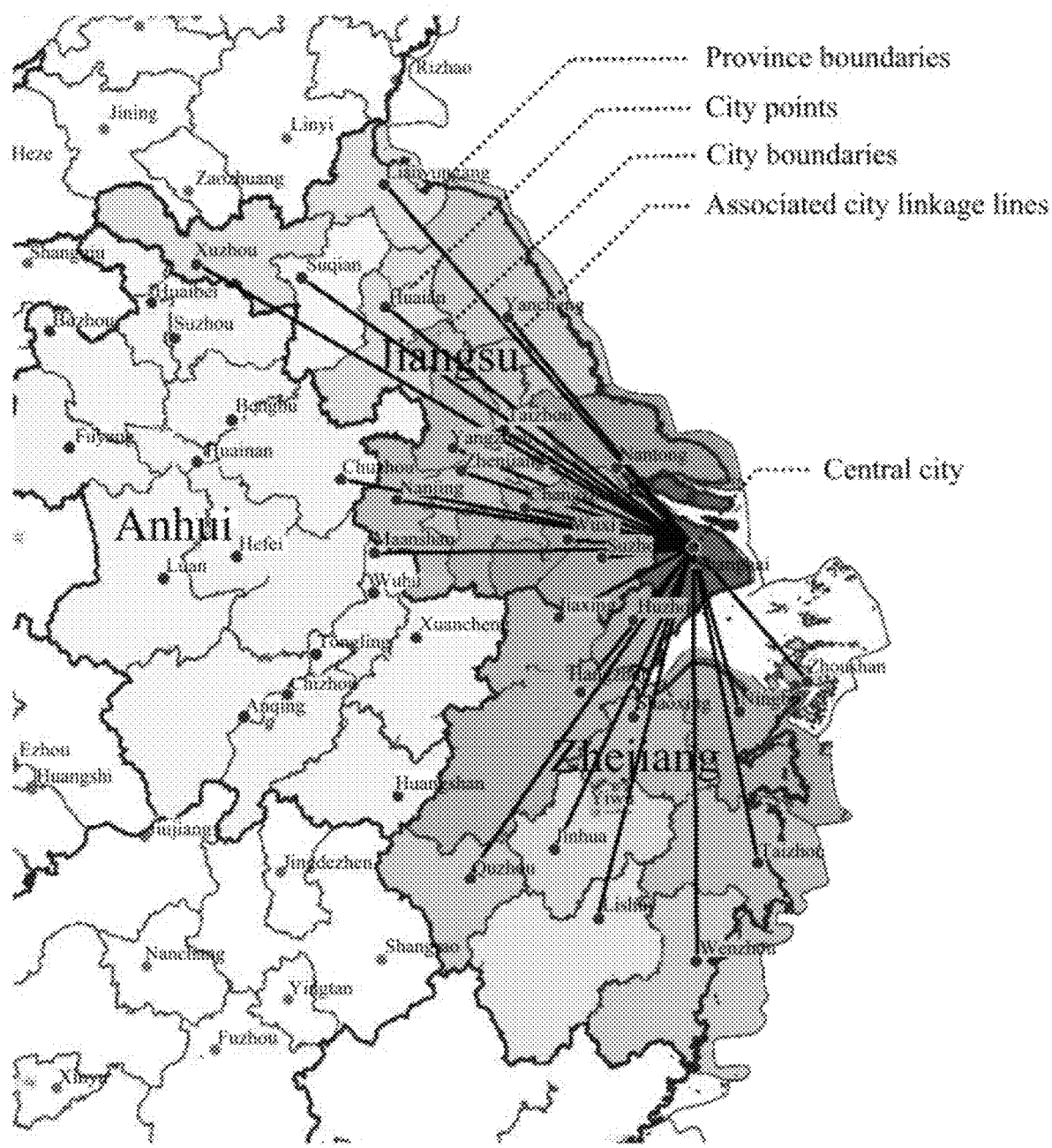
FIG. 2 is a schematic diagram of an example of regional inter-city flow associated cities.
Figure 3:
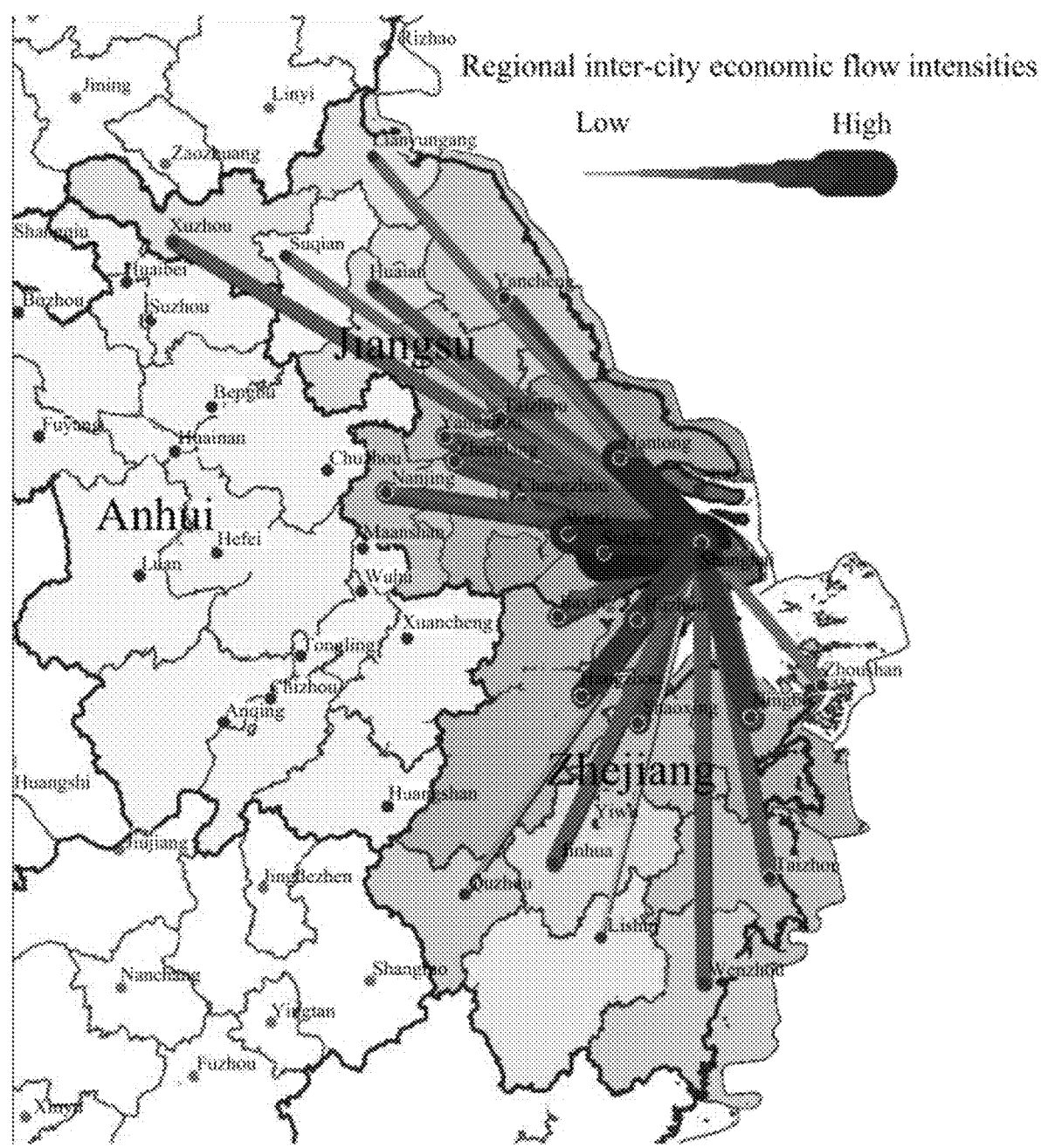
FIG. 3 is a schematic diagram of an example of regional inter-city economic flow intensities.
Figure 4:
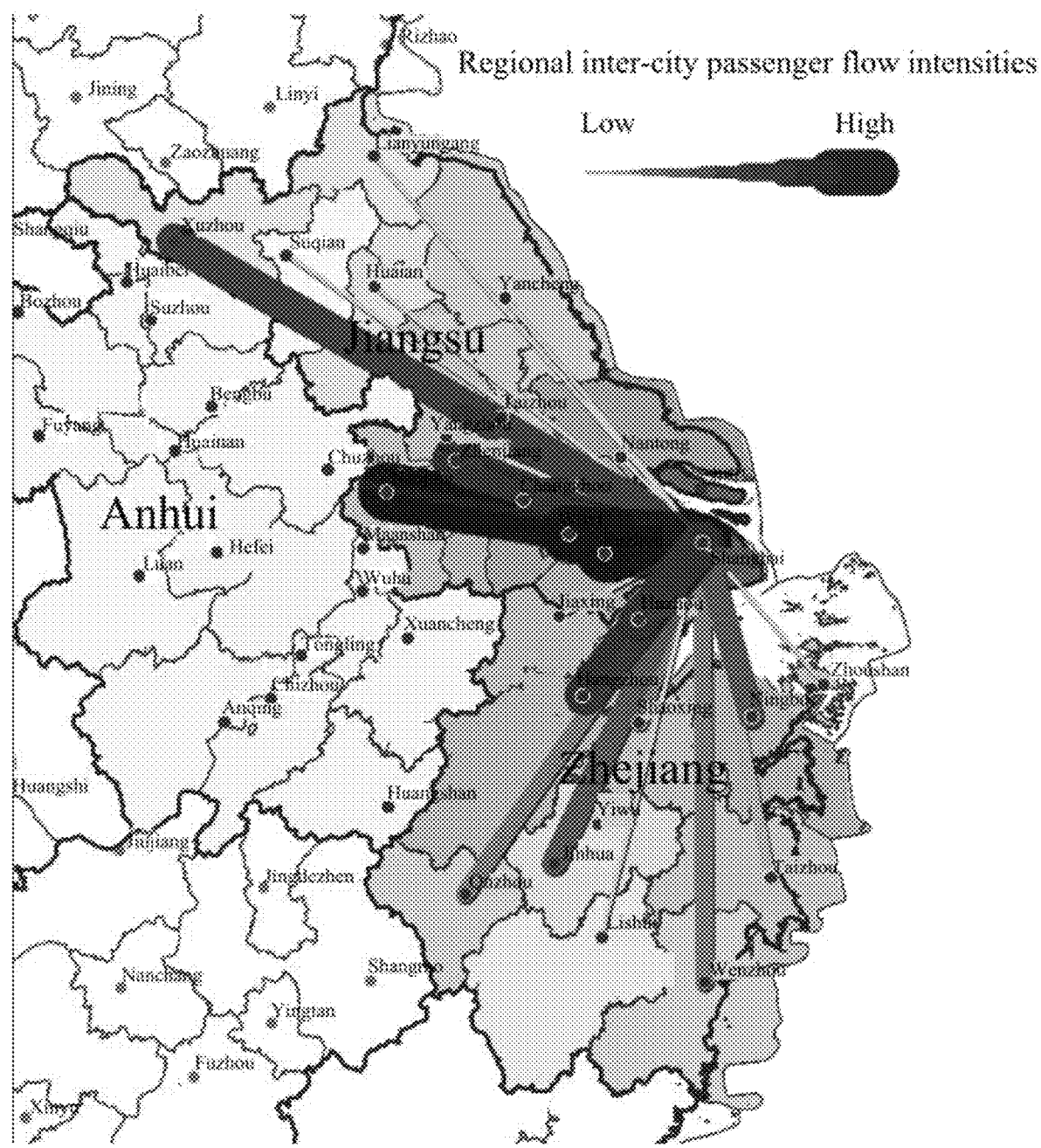
FIG. 4 is a schematic diagram of an example of regional inter-city passenger flow intensities.
Figure 5:
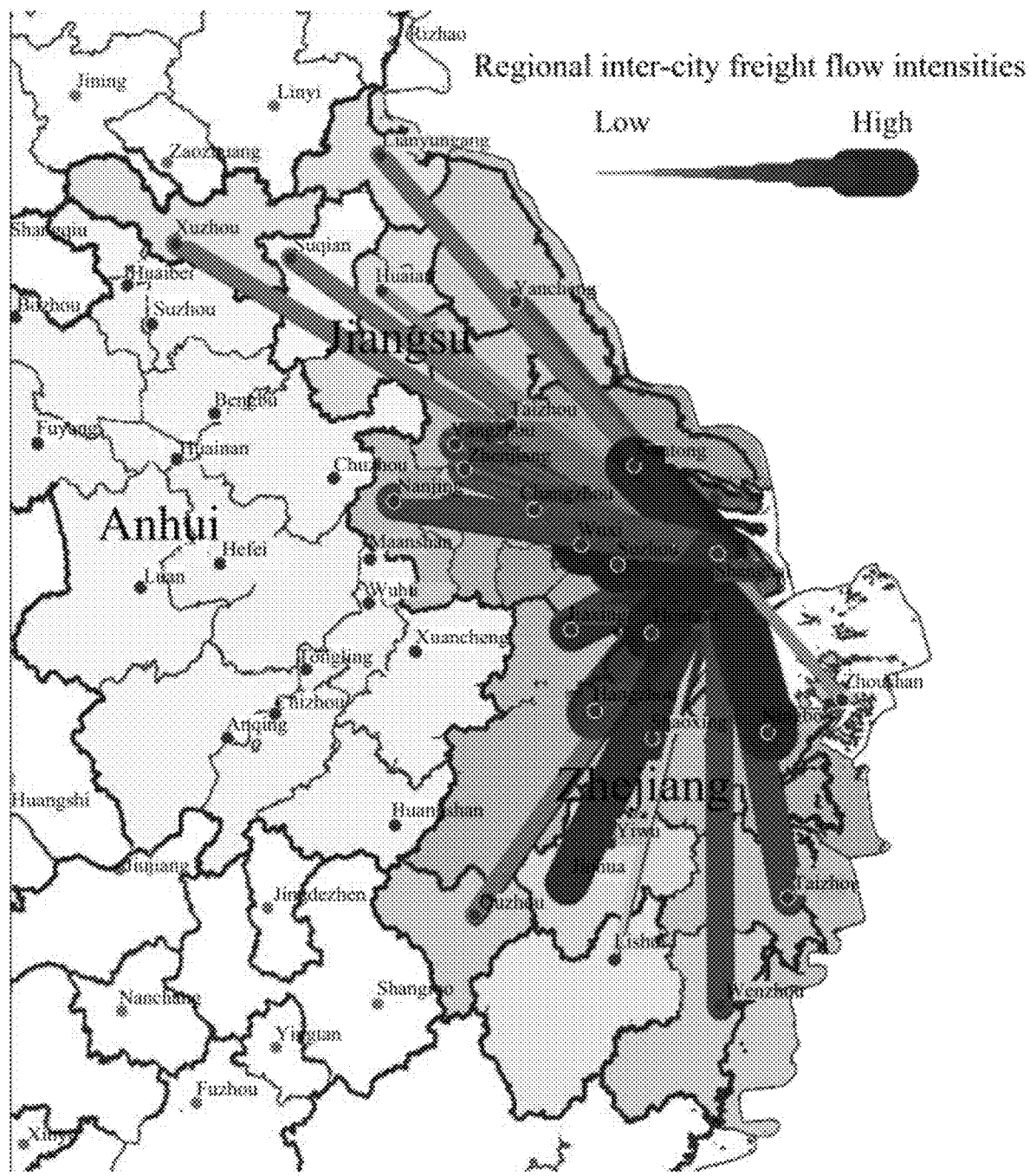
FIG. 5 is a schematic diagram of an example of regional inter-city freight flow intensities.
Figure 6:
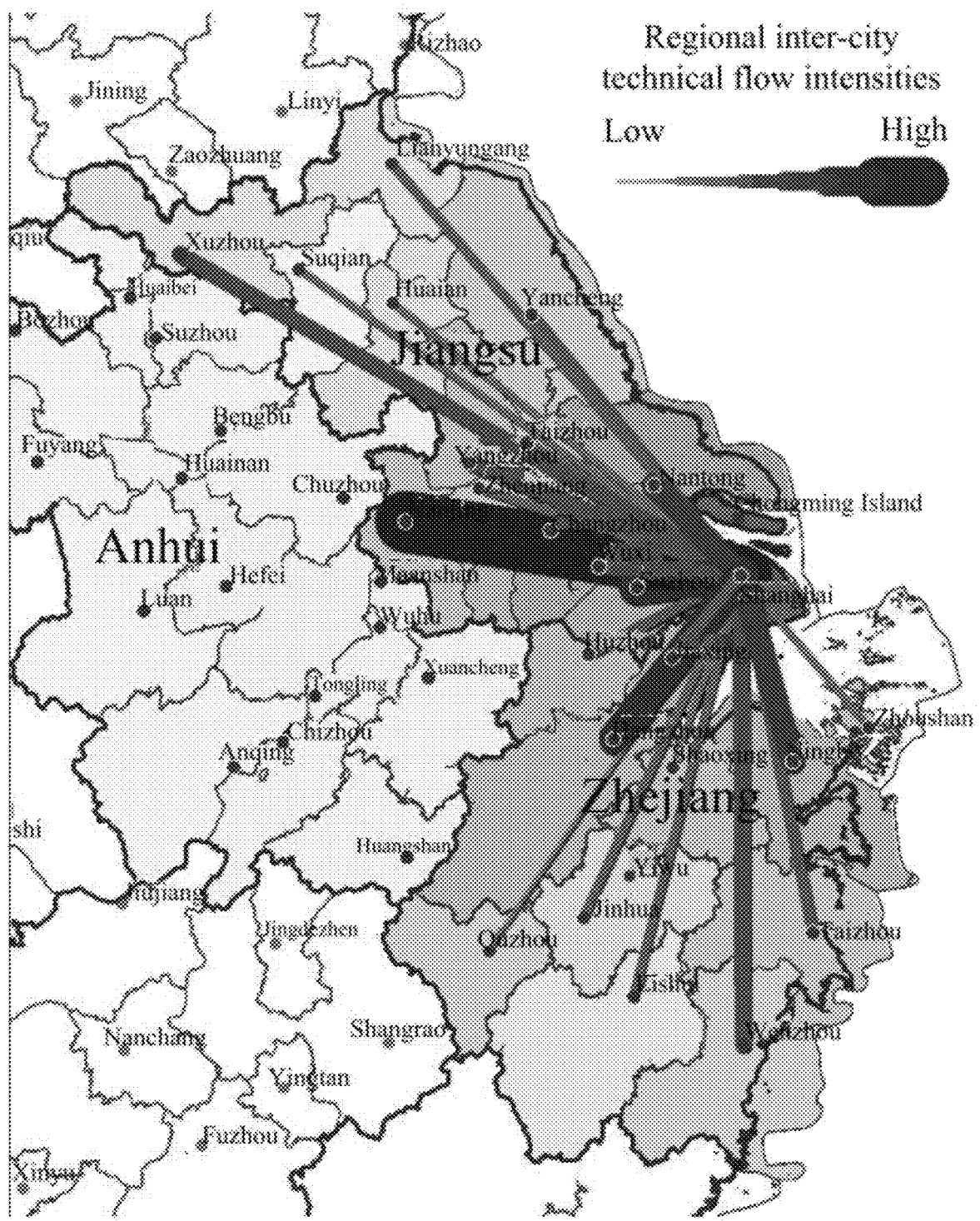
FIG. 6 is a schematic diagram of an example of regional inter-city technical flow intensities.
Figure 7:
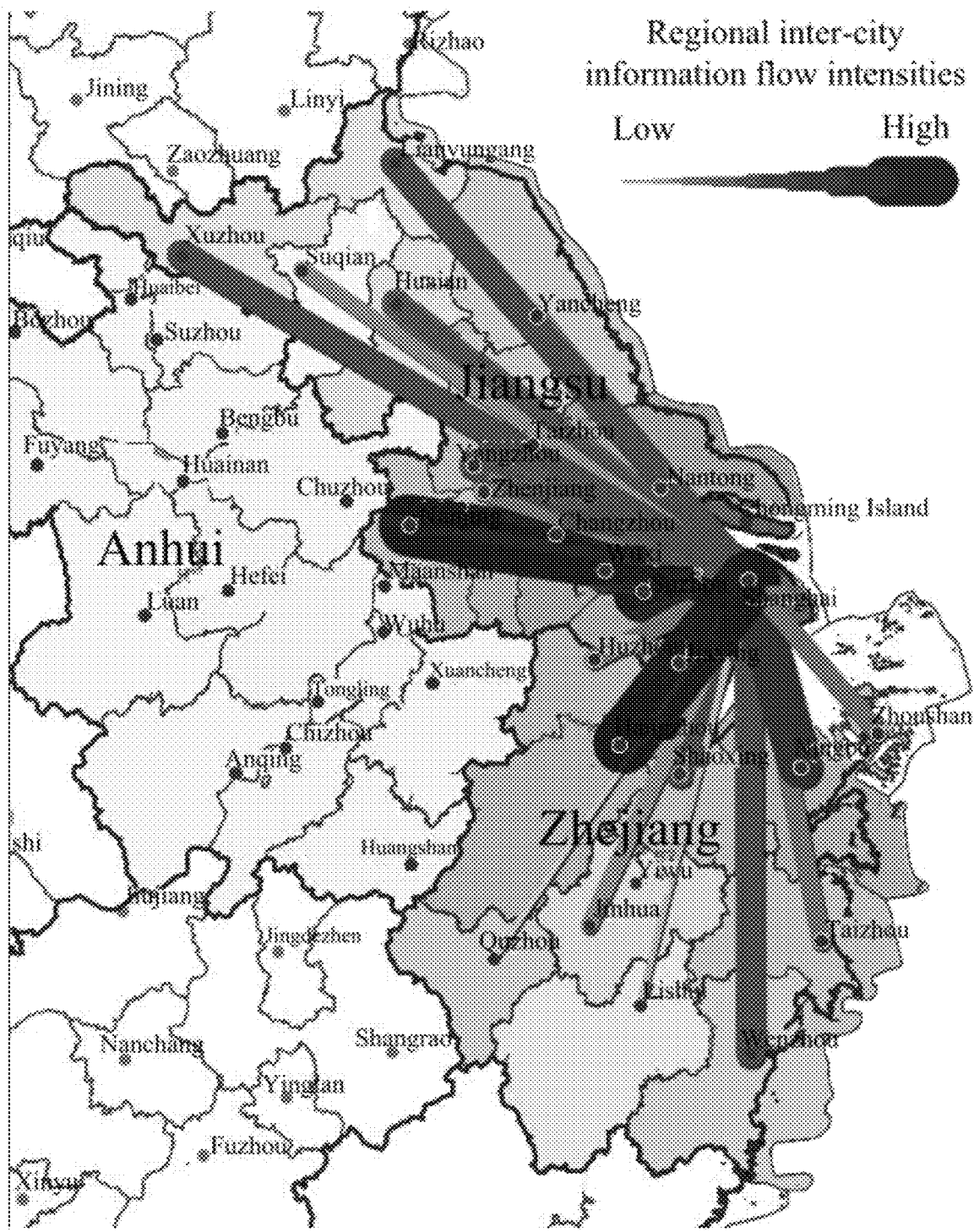
FIG. 7 is a schematic diagram of an example of regional inter-city information flow intensities.
Figure 8:
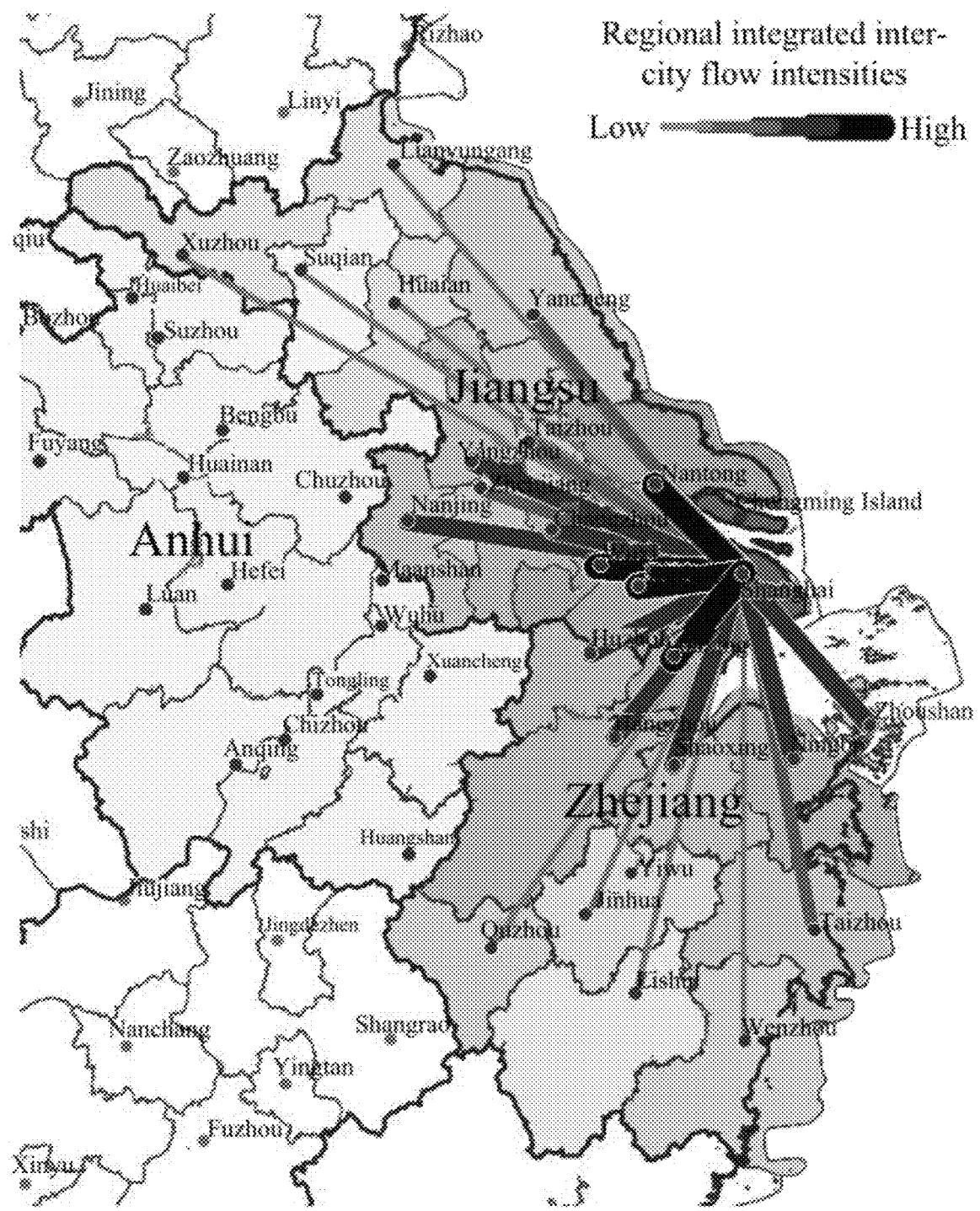
FIG. 8 is a schematic diagram of an example of regional integrated inter-city flow intensities.
Figure 9:
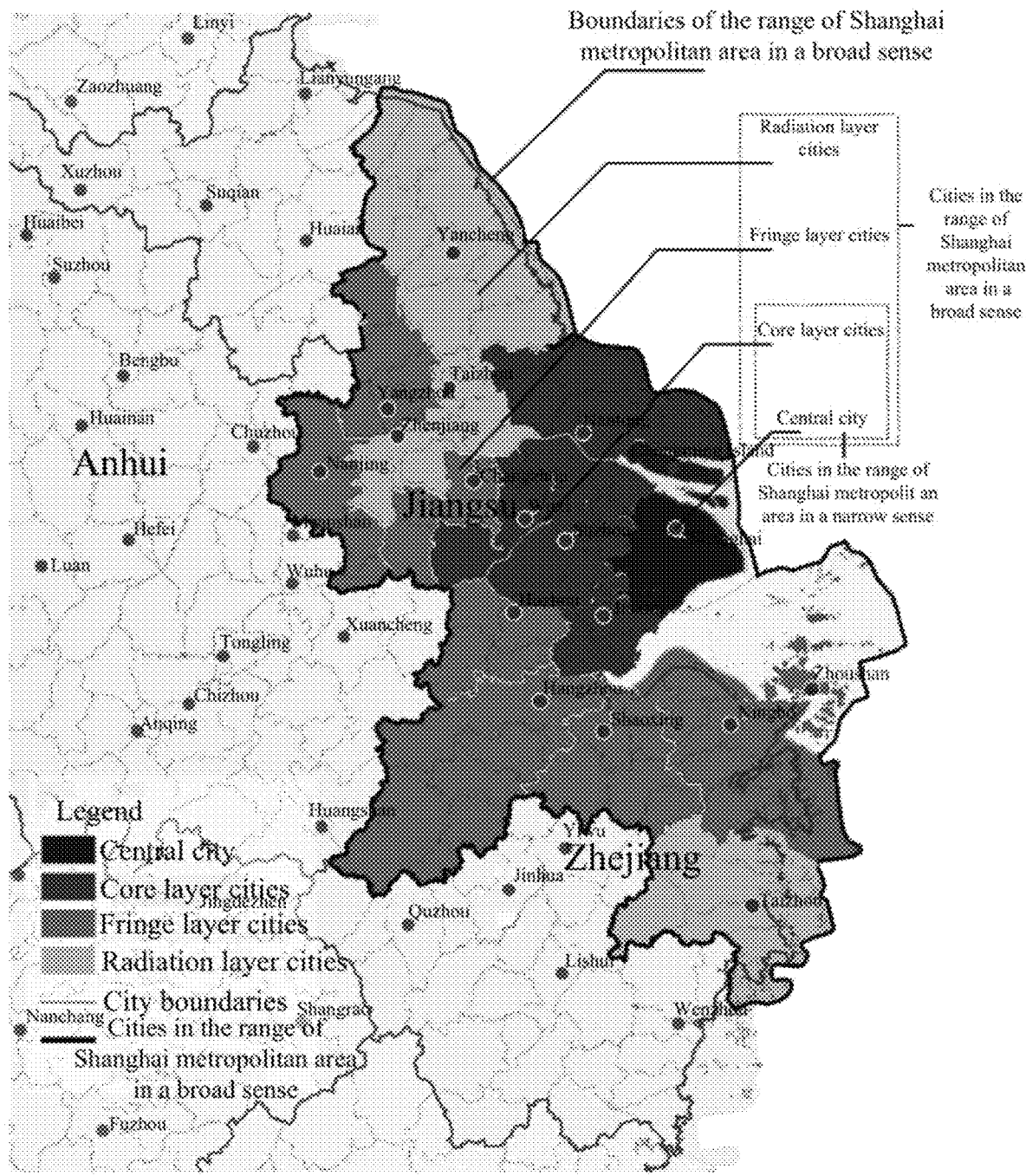
FIG. 9 is a schematic diagram of an example illustrating regional division of a metropolitan area.

The technical solution of the present invention is illustrated in detail with reference to an example and the accompanying drawings of a method for defining a Shanghai metropolitan area (with Shanghai as its regional central city) based on regional inter-city flows.

Step 1: Determine an urban agglomeration regional range centered with Shanghai as a spatial range of a metropolitan area to be defined, make certain of to-be-measured basic city units in the regional range as cities above prefecture level, and further determine inter-city flow associated cities.

Step 1.1: Select a metropolitan city Shanghai (city code: A) as a regional core and as a central city of the metropolitan area.

Step 1.2: Define Jiangsu province and Zhejiang province neighboring to Shanghai, and define a to-be-measured regional inter-city flow spatial range covering Jiangsu province, Zhejiang province, and the central city Shanghai.

Step 1.3: Based on the to-be-measured regional inter-city flow spatial range defined in Step 1.2, select cities at prefecture level and above in the range as to-be-measured basic city units covering 13 cities above prefecture level in Jiangsu province (sequentially numbered as $B_1$ to $B_{13}$, and 11 cities above prefecture level in Zhejiang province (sequentially numbered as $B_{14}$ to $B_{24}$), and determine 24 cities with the city code $B_i$ (i=1 to 24) that have inter-city linkage with Shanghai A.

Step 1.4: Based on Step 1.3, further determine to-be-measured regional inter-city flow associated cities in combinations of $A\_B_1$, $A\_B_2$, ..., $A\_B_i$, ..., $A\_B_{24}$.

Step 2: Measure, according to the associated cities determined in Step 1, itemized regional inter-city flows of each group of the associated cities, where five items, namely, economic flow, passenger flow, freight flow, technical flow, and information flow are included.

Step 2.1: Measure inter-city economic flow of the associated cities $A\_B_i$ determined in Step 1.4: acquire, through city statistical yearbooks and related city data materials of Shanghai city, Jiangsu province, and Zhejiang province, non-agricultural population $U_A$, $U_{B_i}$ of each city, Gross Domestic Product (GDP) $G_A$, $G_{B_i}$ of each city; measure, through an electronic map, a spatial linear distance $D_{AB_i}$ between Shanghai and each of the other cities $B_i$; and calculate inter-city economic linkage volumes $E_{AB_i}$ and corresponding inter-city economic flow intensities $Ef_{AB_i}$ of the associated cities in the region by using the following formulas:

$$E_{AB_i} = \frac{\left(\sqrt{U_A G_A} \times \sqrt{U_{B_i} G_{B_i}}\right)}{D_{AB_i}^2}; Ef_{AB_i} = \frac{E_{AB_i}}{\sum_{n=1}^{24} E_{AB_n}}.$$

Step 2.2: Measure inter-city passenger flow of the associated cities $A\_B_i$ determined in Step 1.4; acquire daily highway long-distance passenger traffic shifts $PC_{AB_i}$ and daily railway stopover shifts $PR_{AB_i}$ between Shanghai A and each of the other cities $B_i$; determine that the average daily traffic volume coefficient α of coaches is 0.1 and the average daily traffic volume coefficient β of railways is 0.9 according to differences of the average daily departure frequency and unit traffic volume of the coaches and railways; and calculate a ratio of inter-city passenger traffic linkage volume of each group of the associated cities in the total regional passenger traffic linkage volume, to obtain the inter-city passenger flow intensity $Pf_{AB_i}$ of each group of the associated cities in the region:

$$Pf_{AB_i} = \frac{PC_{AB_i}}{\sum_{n=1}^{24} PC_{AB_n}} \times \alpha + \frac{PR_{AB_i}}{\sum_{n=1}^{24} PR_{AB_n}} \times \beta$$

Step 2.3: Measure inter-city freight flow of the associated cities $A\_B_i$ determined in Step 1.4; acquire highway mileages $M_A$, $M_{B_i}$ in each city, total highway freight turnover $R_A$, $R_{B_i}$ of each city, and the spatial linear distance $D_{AB_i}$ between Shanghai A and each of the other cities $B_i$ measured through an electronic map; and calculate the inter-city freight linkage volume $F_{AB_i}$ and the inter-city freight flow intensity $Ff_{AB_i}$ of each group of the associated cities:

$$F_{AB_i} = \frac{\left(\sqrt{M_A R_A} \times \sqrt{M_{B_i} R_{B_i}}\right)}{D_{AE_i}^2}; Ff_{AB_i} = \frac{F_{AB_i}}{\sum_{i=1}^{24} F_{AB_i}}.$$

Step 2.4: measuring inter-city technical flow of the associated cities $A\_B_i$ determined in Step 1.4; count the number of articles $C_{AB_i}$ collaborated by colleges and universities as well as research institutions from Shanghai A and each of the other cities $B_i$ by using a geographical retrieval tool for the item "author affiliation" in the "China National Knowledge Infrastructure" bibliographic database; and calculate a ratio of innovative technology cooperation frequency of each group of the associated cities in the total regional innovative technology cooperation volume, to obtain the inter-city technical flow intensity $Cf_{AB_i}$ of each group of the associated cities in the region:

$$Cf_{AB_i} = \frac{C_{AB_i}}{\sum_{n=1}^{24} C_{AB_n}}$$

Step 2.5: measuring inter-city information flow of the associated cities $A\_B_i$ determined in Step 1.4; make statistics on mutual network search frequency $I_{AB_i}$ between Shanghai A and each of the other cities $B_i$ by using search attention degree data of network users in "Baidu Index", and use network attention degree between users to represent inter-city network linkage volumes; and calculate a ratio of network information linkage volume of each group of the associated cities in the total regional network information linkage volume by using the following formula, to obtain the inter-city information flow intensity $If_{AB_i}$ of each group of the associated cities in the region:

$$If_{AB_i} = \frac{I_{AB_i}}{\sum_{n=1}^{24} I_{AB_n}}$$

Step 3: Calculate through weighing, according to the five itemized regional inter-city flows, namely, economic flow, passenger flow, freight flow, technical flow, and information flow that are measured in Step 2, integrated inter-city flow intensities and membership degrees thereof between a central city and other cities.

Step 3.1; Adopt an average weighing manner based on the close significance of the five itemized regional inter-city flows, that is, the weight coefficient of the five itemized regional inter-city flows is 0.25.

Step 3.2: Calculate the integrated inter-city flow intensity $f_{AB_i}$ between A and each of the other cities $B_i$ through the following average weighing formula according to the inter-city economic flow intensity $Ef_{AB_i}$, inter-city passenger flow intensity $Pf_{AB_i}$, inter-city freight flow intensity $Ff_{AB_i}$, inter-city technical flow intensity $Cf_{AB_i}$, and inter-city information flow intensity $If_{AB_i}$ between the central city A and each of the other cities $B_i$ that are measured in Step 2:

$$f_{AB_i} = Ef_{AB_i} \times \delta_1 + Pf_{AB_i} \times \delta_2 + Ff_{AB_i} \times \delta_3 + Cf_{AB_i} \times \delta_4 + If_{AB_i} \times \delta_5;$$

Step 3.3: Obtain, through normalized standardization, the integrated inter-city flow intensity membership degree $\overline{f}_{AB_i}$ between A and each of the other cities $B_i$ according to the integrated inter-city flow intensity $f_{AB_i}$ between A and each of the other cities $B_i$ measured in Step 3.2:

$$\overline{f}_{AB_i} = \frac{f_{AB_i}}{\sum_{n=1}^{24} f_{AB_n}} \times 100\%$$

Step 4: Draw CAD data of related vectors about provinces and cities in the region and record the data into an ArcGIS library, record, in the ArcGIS library, the five itemized regional inter-city flow intensity values measured in Step 2 as well as data of the integrated inter-city flow intensity membership degrees between Shanghai and the other associated cities that are measured in Step 3, and establish a regional inter-city flow database through association between spatial data and table data.

Step 4.1: Import, into ArcGIS software, a CAD data layer of vector boundary lines of Shanghai city, Jiangsu province, Zhejiang province, and cities in the two provinces as well as a CAD data layer of vector points at spatial positions of administrative centers of Shanghai and each of the other cities that are defined in Step 1, and output a planar layer named "city boundaries" and a dotted layer named "city points".

Step 4.2: Draw, in AutoCAD, a linkage network line between Shanghai A and each of the other cities $B_i$ by using the municipal administrative centers of the cities determined in Step 4.1 as connecting ends, number the linkage network line as $A\_B_i$, obtain a CAD layer of vector linkage lines between the associated cities, import the CAD data layer into the ArcGIS software, and output a linear layer named "city linkage lines".

Step 4.3: Record, in the ArcGIS database, the five itemized regional inter-city flow intensity values: economic flow intensity $Ef_{AB_i}'$, passenger flow intensity $Pf_{AB_i}'$, freight flow intensity $Ff_{AB_i}'$, technical flow intensity $Cf_{AB_i}'$, information flow intensity $If_{AB_i}$, and integrated inter-city flow intensity membership degree $\bar{T}_{AB_i}$ between Shanghai A and each of the other cities $B_i$ that are measured in Step 2, and make one-to-one corresponding data association between the above measured data and the "$A\_B_i$ city linkage lines" in Step 4.2).

Step 4.4: Perform spatial association of vector layers on each layer of the data and table association on the measurement data recorded in ArcGIS in Step 4.1, Step 4.2, and Step 4.3, and establish a regional inter-city flow database.

Step 4.5: Automatically display the line thickness of "$A\_B_i$ city linkage lines" according to the five itemized regional inter-city flow intensity values $Ef_{AB_i}$, $Pf_{AB_i}$, $Ff_{AB_i}$, $Cf_{AB_i}$, $If_{AB_i}$, and output five schematic diagrams of itemized regional inter-city flow intensities by ArcGIS, automatically display the line thickness of "$A\_B_i$ city linkage lines" according to the values of the integrated inter-city flow intensity membership degrees $\bar{T}_{AB_i}$, and output a schematic diagram of integrated inter-city flow intensities by ArcGIS.

Step 5: Perform four groups of naturally intermittent type clustering analysis on the data of the integrated inter-city flow intensity membership degrees $\bar{T}_{AB_i}$ in the regional inter-city flow database established in Step 4, obtain member cities belonging to a core layer, a fringe layer, and a radiation layer of the metropolitan area respectively according to clustered data segments in descending order by size, and finally determine the range of the metropolitan area in a narrow sense and in a broad sense.

Step 5.1: Perform four groups of naturally intermittent type clustering on the data of the integrated inter-city flow intensity membership degree $\bar{T}_{AB_i}$ of each "city linkage line" in Step 4.4) by using a naturally intermittent type clustering method through a "clustering analysis" module in ArcGIS software, so that the inter-group difference of the integrated inter-city flow intensity membership degrees is the maximum and the intra-group difference of the integrated inter-city flow intensity membership degrees is the minimum; and sort four groups of data segments after clustering in descending order by size into: a first group, a second group, a third group, and a fourth group.

Step 5.2: Define other cities associated with Shanghai A and corresponding to the "city linkage lines" in the first group of data segments as member cities $B_{core}$ belonging to a core layer of the metropolitan area and including Nantong city, Wuxi city, and Suzhou city of Jiangsu province and Jiaxing city of Zhejiang province; define other cities associated with the central city A and corresponding to the "city linkage lines" in the second group of data segments as member cities $B_{fringe}$ belonging to a fringe layer of the metropolitan area and including Yangzhou city, Nanjing city, and Changzhou city of Jiangsu province and Huzhou city, Hangzhou city, Shaoxing city, Ningbo city, and Zhoushan city of Zhejiang province; define other cities associated with the central city A and corresponding to the "city linkage lines" in the third group of data segments as member cities $B_{radiation}$ belonging to a radiation layer of the metropolitan area and including Yancheng city, Taizhou city, and Zhenjiang city of Jiangsu province and Taizhou city of Zhejiang province, where other cities associated with the central city A and corresponding to the "city linkage lines" in the fourth group of data segments are not covered in the range of the metropolitan area centered with the city A, and include Lian Yungang city, Xuzhou city, Suqian city, and Huai'an city of Jiangsu province and Quzhou city, Jinhua city, Lishui city, and Wenzhou city of Zhejiang province.

Step 5.3: Obtain the range of the metropolitan area centered with the city A in a narrow sense and in a broad sense based on Step 5.2, where the range of the metropolitan area in a narrow sense consists of the central city A and the core layer cities $B_{core}$, including Shanghai city, Nantong city, Wuxi city, Suzhou city, and Jiaxing city; and the range of the metropolitan area in a broad sense consists of the central city A, the core layer cities $B_{core}$, the fringe layer cities $B_{fringe}$, and the radiation layer cities $B_{radiation}$, including Shanghai city, Nantong city, Wuxi city, Suzhou city, Jiaxing city, Yangzhou city, Nanjing city, Changzhou city, Huzhou city, Hangzhou city, Shaoxing city, Ningbo city, Zhoushan city, Yancheng city, Taizhou city, Zhenjiang city, and Taizhou city.

The preferred embodiments of the present invention are described above, and it should be noted that persons of ordinary skill in the art can make several improvements and modifications without departing from the principle of the present invention. All these improvements and modifications shall fall within the protection scope of the present invention.

What is claimed is:

1. A method for defining a metropolitan area based on a regional inter-city flow intensity measurement model, comprising:

Step 1: determining an urban agglomeration regional range centered with a metropolitan city as a spatial range of the metropolitan area to be defined, identifying a plurality of to-be-measured basic city units in the urban agglomeration regional range, and further determining inter-city flow associated cities;

Step 2: measuring, according to the inter-city flow associated cities determined in Step 1, itemized regional inter-city flow intensities of each group of the inter-city flow associated cities, wherein, the itemized regional inter-city flow intensities include an economic flow, a passenger flow, a freight flow, a technical flow, and an information flow; wherein the Step 2 comprises:

Step 2.1: measuring an inter-city economic flow of the associated cities $A\_B_i$ determined in Step 1.4; acquiring, through city statistical yearbooks and related city data materials of the provinces and cities, non-agricultural population $U_A$, $U_{B_i}$ of each city, GDP $G_A$, $G_{B_i}$ of each city, and a spatial linear distance $D_{AB_i}$ between the central city A and each of the associated cities $B_i$; and calculating an inter-city economic linkage volumes $E_{AB_i}$ and corresponding inter-city economic flow intensities $Ef_{AB_i}$ of the associated cities:

$$E_{AB_i} = \frac{(\sqrt{U_A G_A} \times \sqrt{U_{B_i} G_{B_i}})}{D_{AB_i}^2}; \quad Ef_{AB_i} = \frac{E_{AB_i}}{\sum_{n=2}^{N} E_{AB_n}};$$

Step 2.2: measuring an inter-city passenger flow of the associated cities A_B$_i$, determined in Step 1.4; acquiring daily highway long-distance passenger traffic shifts PC$_{AB_i}$ and daily railway stopover shifts PR$_{AB_i}$ between the central city A and each of the associated cities B$_i$; and calculating a ratio of an inter-city passenger traffic linkage volume of each group of the associated cities in a total regional passenger traffic linkage volume, to obtain an inter-city passenger flow intensity Pf$_{AB_i}$ of each group of the associated cities in the region:

$$Pf_{AB_i} = \frac{PC_{AB_i}}{\sum_{n=1}^{N} PC_{AB_n}} \times \alpha + \frac{PR_{AB_i}}{\sum_{n=1}^{N} PR_{AB_n}} \times \beta;$$

wherein α is 0.1 and β is 0.9;

Step 2.3: measuring an inter-city freight flow of the associated A_B$_i$ determined in Step 1.4; acquiring highway mileages M$_A$, M$_{B_i}$ in each city, total highway freight turnovers R$_A$, R$_{B_i}$ of each city, and a spatial linear distance D$_{AB_i}$ between the central city A and each of the associated cities B$_i$; and calculating an inter-city freight linkage volume F$_{AB_i}$ an inter-city freight flow intensity Ff$_{AB_i}$ of each group of the associated cities:

$$F_{AB_i} = \frac{\left(\sqrt{M_A R_A} \times \sqrt{M_{B_i} R_{B_i}}\right)}{D_{AB_i}^2}; \quad Ff_{AB_i} = \frac{F_{AB_i}}{\sum_{i=1}^{N} F_{AB_i}};$$

Step 2.4: measuring an inter-city technical flow of the associated cities A_B$_i$ determined in Step 1.4; acquiring the number of articles C$_{AB_i}$ collaborated by colleges at universities as well as research institutions from the central city A and each of the associated cities B$_i$; and calculating a ratio of innovative technology cooperation frequency of each group of the associated cities in a total regional innovative technology cooperation volume, to obtain an inter-city technical flow intensity Cf$_{AB_i}$ of each group of the associated cities in the region:

$$Cf_{AB_i} = \frac{C_{AB_i}}{\sum_{n=1}^{N} C_{AB_n}};$$

Step 2.5: measuring an inter-city information flow of the associated cities A_B$_i$ determined in Step 1.4; acquiring a mutual network search frequency I$_{AB_i}$ between the central city A and each of the associated cities B$_i$; and calculating a ratio of network information linkage volume of each group of the associated cities in a total regional network information linkage volume, to obtain an inter-city information flow intensity If$_{AB_i}$ of each group of the associated cities in the region:

$$If_{AB_i} = \frac{I_{AB_i}}{\sum_{n=1}^{N} I_{AB_n}}.$$

Step 3: calculating integrated inter-city flow intensities and integrated inter-city flow intensity membership degrees between a central city and associated cities through weighing according to itemized regional inter-city flow intensity values of the economic flow, the passenger flow, the freight flow, the technical flow, and the information flow measured in Step 2;

Step 4: drawing a Computer Aided Design (CAD) graph of related vectors about provinces and cities in a region and recording data into Geographic Information System(GIS) library, recording the itemized regional inter-city flow intensity values measured in Step 2 and data of the integrated inter-city flow intensity membership degrees between the central city and the associated cities measured in Step 3 in the GIS library, and establishing a regional inter-city flow database through an association between spatial data and table data;

Step 5: performing four groups of naturally intermittent type clustering analysis on the data of the integrated inter-city flow intensity membership degrees $\bar{f}_{AB_i}$ in the regional inter-city flow database established in Step 4, obtaining member cities belonging to a core layer, a fringe layer, and a radiation layer of the metropolitan area respectively according to clustered data segments in descending order by size, and finally determining a narrow-sense range and a broad-sense range of the metropolitan area, wherein the step of determining an urban agglomeration regional range to be measured and inter-city flow associated cities in Step 1 comprises:

Step 1.1: selecting a metropolitan city A as a regional core and as the central city of the metropolitan area;

Step 1.2: defining provinces and cities neighboring to the metropolitan city A selected in Step 1.1 and a province of the metropolitan city A as a to-be-measured regional inter-city flow spatial range;

Step 1.3: based on the to-be-measured regional inter-city flow spatial range defined in Step 1.2, selecting cities at a prefecture level or above the prefecture level in the to-be-measured regional inter-city flow spatial range as to-be-measured basic city units, and determining N associated cities having an inter-city linkage with the metropolitan city A, wherein the N cities are numbered as B$_1$, B$_2$, ..., B$_i$, ..., B$_N$;

Step 1.4: based on the city B$_i$ determined in Step 1.3, obtaining to-be-measured regional inter-city flow associated cities in combinations of A_B$_1$, A_B$_2$, ..., A_B$_i$, ..., A_B$_N$, wherein the step of recording, in GIS, the CAD data of related vectors about the provinces and cities in the region as well as the itemized regional inter-city flow intensity data and the integrated inter-city flow intensity data measured in Step 2 and Step 3, and establishing a regional inter-city flow database in Step 4 comprises:

Step 4.1: importing, into the GIS database, a CAD data layer of vector boundary lines of the provinces and cities as well as a CAD data layer of vector points at spatial positions of administrative centers of the central city and each of the associated cities in the urban agglomeration regional range defined in Step 1;

Step 4.2: drawing, in a CAD software, a linkage network line between the central city A and each of the associated cities B$_i$, numbering the linkage network line as A_B$_i$, and importing a CAD layer of vector linkage lines between the associated cities into the GIS database;

Step 4.3: translating, from an electronic form file format, and recording, in the GIS database, the itemized regional inter-city flow intensity values including an economic flow intensity Ef$_{AB_i}$, a passenger flow intensity Pf$_{AB_i}$, a freight flow intensity Ff$_{AB_i}$, a technical flow intensity Cf$_{AB_i}$, an information flow intensity If$_{AB_i}$, and an integrated inter-city flow intensity membership degree $\bar{T}_{AB_i}$ between the central city A and each of the associated cities $B_i$ measured in Step 2;

Step 4.4: performing a spatial association of vector layers on each layer of a data and table association on measurement data in Step 4.1, Step 4.2, and Step 4.3, and establishing a regional inter-city flow database;

Step 4.5: automatically displaying a line thickness of "A_$B_i$ city linkage lines" according to the itemized regional inter-city flow intensity values, and outputting schematic diagrams of the itemized regional inter-city flow intensities by GIS; automatically displaying the line thickness of "A_$B_i$ city linkage lines" according to the values of the integrated inter-city flow intensity membership degrees $\bar{T}_{AB_i}$, and outputting a schematic diagram of the integrated inter-city flow intensities.

2. The method for defining a metropolitan area based on a regional inter-city flow intensity measurement model according to claim 1, wherein the step of performing four groups of naturally intermittent type clustering analysis on the data of the integrated inter-city flow intensity membership degrees $\bar{T}_{AB_i}$ in the regional inter-city flow database, obtaining member cities belonging to a core layer, a fringe layer, and a radiation layer of the metropolitan area respectively according to clustered data segments in descending order by size, and finally determining the range of the metropolitan area in a narrow sense and in a broad sense in Step 5 comprises:

Step 5.1: performing four groups of naturally intermittent type clustering on the data of the integrated inter-city flow intensity membership degrees $\bar{T}_{AB_i}$ of each "city linkage line" in Step 4.4 by using a naturally intermittent type clustering method through a "clustering analysis" module in an GIS software, and sorting the four groups of data segments after clustering in descending order by size into: a first group, a second group, a third group, and a fourth group;

Step 5.2: defining the associated cities of the central city A and corresponding to the "city linkage lines" in the first group, the second group, and the third group of data segments as member cities belonging to a core layer, a fringe layer, and a radiation layer of the metropolitan area, wherein—the associated cities corresponding to the "city linkage lines" in the fourth group of data segments are not covered in the range of the metropolitan area;

Step 5.3: obtaining the range of the metropolitan area centered with the central city A in the narrow sense and in the broad sense based on Step 5.2, wherein the range of the metropolitan area in the narrow sense consists of the central city and core layer cities; and the range of the metropolitan area in the broad sense consists of the central city, the core layer cities, fringe layer cities, and radiation layer cities.

* * * * *